United States Patent [19]
Ito et al.

[11] Patent Number: 5,157,061
[45] Date of Patent: Oct. 20, 1992

[54] EPOXY RESIN CONTAINING AN EPOXY RESIN-MODIFIED SILICONE OIL FLEXIBILIZER

[75] Inventors: Hiromi Ito; Ichiro Takahashi, both of Amagasaki, Japan

[73] Assignee: Mitsubishi Denki Kabushiki Kaisha, Tokyo, Japan

[21] Appl. No.: 333,043

[22] Filed: Apr. 4, 1989

[30] Foreign Application Priority Data

Apr. 5, 1988 [JP] Japan .................................. 63-84511
May 11, 1988 [JP] Japan .................................. 63-115269
Jun. 28, 1988 [JP] Japan .................................. 63-161849

[51] Int. Cl.$^5$ .................. C08K 3/36; C08L 63/02; C08L 63/04
[52] U.S. Cl. .................................. 523/433; 525/476; 525/487; 525/525
[58] Field of Search .................. 525/476, 487, 525; 523/433

[56] References Cited

U.S. PATENT DOCUMENTS

| | | | |
|---|---|---|---|
| 3,215,648 | 11/1965 | Duffy et al. | 525/487 |
| 4,022,753 | 5/1977 | Lohse et al. | 525/487 |
| 4,720,515 | 1/1988 | Iji et al. | 525/476 |
| 4,923,912 | 5/1990 | Sasaki et al. | 525/476 |

FOREIGN PATENT DOCUMENTS

| | | | |
|---|---|---|---|
| 61-133222 | 6/1986 | Japan | 525/487 |
| 62-254454 | 11/1987 | Japan | 525/476 |
| 63-179915 | 7/1988 | Japan | 525/487 |
| 63-309515 | 12/1988 | Japan | 525/476 |
| 64-04614 | 1/1989 | Japan | 525/476 |

OTHER PUBLICATIONS

English translation of Japanese Patent No. 62-254454, 22 pages.

Primary Examiner—Robert E. Sellers
Attorney, Agent, or Firm—Leydig, Voit & Mayer

[57] ABSTRACT

An epoxy resin composition for encapsulating a semiconductor device comprises a flexibilizer obtained by pre-reaction of an epoxy resin and at least one modified silicone oil having the formula:

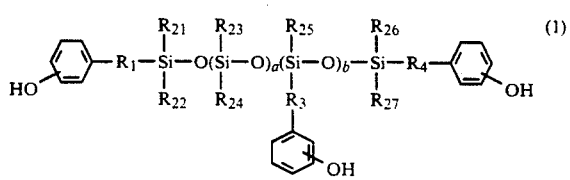

where $R_1$, $R_3$, and $R_4$ are divalent organic groups; $R_{21}$, $R_{22}$, $R_{23}$, $R_{24}$, $R_{25}$, $R_{26}$, and $R_{27}$ are respectively selected from the group consisting of an alkyl group having from 1 to 5 carbon atoms, a hydroxyalkyl group having from 1 to 5 carbon atoms, an alkoxy group having from 1 to 5 carbon atoms, a phenyl group, and a fluorine-substituted alkyl group having from 1 to 5 carbon atoms; a is an integer from 10 to 300; and b is an integer from 2 to 10, in which $0 \leq b/(a+b) \leq 0.32$, and wherein the equivalent ratio of phenolic hydroxyl groups in said modified silicone oil to epoxy groups of the epoxy resin of the flexibilizer is from 0.001 to 0.4:1; an epoxy resin other than the flexibilizer; and a curing agent.

19 Claims, No Drawings

EPOXY RESIN CONTAINING AN EPOXY RESIN-MODIFIED SILICONE OIL FLEXIBILIZER

BACKGROUND OF THE INVENTION

1. Field of the Invention

The present invention relates to an epoxy resin composition for encapsulating a semiconductor device, and more particularly to an epoxy resin composition for encapsulating a semiconductor device which provides a cured product which is capable of maintaining the moisture resistance and heat resistance of the epoxy resin and which has a low modulus of elasticity, a low coefficient of thermal expansion, and a high glass transition temperature.

2. Description of the Related Art

In recent years, semiconductor devices have tended to be provided with a larger chip area and an encapsulating resin of a lesser thickness. At the same time, there has been a trend toward a greater degree of integration. Accordingly, if a semiconductor device is encapsulated with a conventional epoxy resin composition, fatal flaws in a semiconductor part can occur, such as a crack in the chip, the cutting of a bonding wire, the sliding of an aluminum wire, and the cracking of the encapsulating resin. This is because the conventional semiconductor encapsulating epoxy resin has been developed from the perspective of heat resistance and moisture resistance, such that the cured product lacks flexibility and an unwanted large stress to the device can result.

Generally, there are two possible measures for reducing the stress to a semiconductor-encapsulating epoxy resin: one is to reduce the thermal strain by decreasing the coefficient of thermal expansion of the resin, and the other is to reduce the stress due to thermal strain by decreasing the modulus of elasticity. In addition, when viewed from the aspect of maintaining the heat resistance and moisture resistance and expanding a temperature region having a small thermal strain, it is necessary to set the glass transition temperature to a high level. A flexibilizer may be added as a method of reducing the stress to a low level. Conventional flexibilizers include, for instance, long-chain alkylene polyamine, polyoxy alkylene glycol, and bisphenol A-type diglycidyl ether having long-chain alkylene oxide. With the method of reducing the modulus of elasticity of a resin by using such a flexibilizer, there is a drawback in that the drop in the glass transition temperature is large, so that the heat resistance and humidity resistance decline. (Refer to Japanese Patent Publication Nos. 59-8718, 59-30820, and 59-226066.)

Meanwhile, to obtain flexibilizers in which the decline in humidity resistance and glass transition temperature is small, elastomer modified flexibilizers have been devised which are obtained from polybutadiene having functional groups capable of reacting with an epoxy resin or phenol resin at both ends, or from a copolymer of butadiene and acrylonitrile. (Refer to Japanese Patent Publication Nos. 58-108220, 58-174416, 58-184204, 62-9248, 59-113021, and 59-58024. However, the aforementioned elastomer flexibilizers have a problem in that their flexibilizing effect disappears over time as the unsaturated bonds in the elastomer are oxidized at high temperature and deteriorate as a result.

In addition, a method is also known in which a silicone resin or a silicone rubber which has a low modulus of elasticity is dispersed in the resin and is an outstanding flexibilizer in terms of electrical properties and thermal stability at a high temperature (refer to Japanese Patent Publication Nos. 62-84147 and 56-4647). However, since a silicone resin has poor adhesive properties with respect to a metal (frame and the like), and since a silicone rubber has a weak interfacial strength with respect to an epoxy matrix, the moisture permeability of the cured product is large, so that there is the problem that the product lacks reliability in that its moisture resistance and mechanical strength are low.

SUMMARY OF THE INVENTION

Accordingly, an object of the present invention is to provide an epoxy resin composition for encapsulating a semiconductor device capable of being cured to a product which is heat resistant and moisture resistant and has a low modulus of elasticity, a low coefficient of thermal expansion, and a high glass transition temperature equivalent to or higher than that of a conventional epoxy resin composition.

To this end, according to the present invention, there is provided an epoxy resin composition for encapsulating a semiconductor device comprising: a flexibilizer obtained by pre-reaction of an epoxy resin and at least one kind of modified silicone oil having the formula:

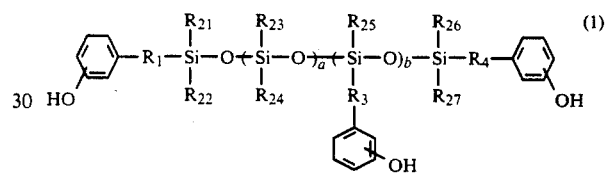

where $R_1$, $R_3$, and $R_4$ are divalent organic groups; $R_{21}$, $R_{22}$, $R_{23}$, $R_{24}$, $R_{25}$, $R_{26}$, and $R_{27}$ are respectively one kind selected from the group consisting of an alkyl group having from 1 to 5 carbon atoms, a hydroxyalkyl group having from 1 to 5 carbon atoms, an alkoxy group having from 1 to 5 carbon atoms, a phenyl group, and a fluorine-substituted alkyl group having from 1 to 5 carbon atoms; a is an integer from 10 to 300; b is an integer from 0 to 10, in which $0 \leq b/(a+b) \leq 0.32$; an epoxy resin; and a curing agent.

DESCRIPTION OF THE PREFERRED EMBODIMENTS

As the epoxy resin which is used as a chief material of a composition in accordance with a first embodiment of the invention, it is possible to cite, for instance, multifunctional epoxy resins such as a cresol-novolak-type epoxy resin, a phenol-novolak-type epoxy resin, an alkyl benzene-modified phenol-novolak-type epoxy resin, a halogenated phenol-novolak-type epoxy resin, a bisphenol A-novolak-type epoxy resin, and tris(-glycidoxyphenyl) methane. However, the epoxy resin should not be restricted to the above, and they may be used singly, or two or more kinds of them may be used in combination.

In addition, the epoxy resin which is reacted with the modified silicone oil and the other epoxy resins the may be used in compositions according to the invention may be of the same kind or different kinds.

As a curing agent for the epoxy resin composition in accordance with the present invention, it is possible to cite phenol-novolak curing agents for a phenol-novolak resin, a cresol-novolak resin, an alkyl modified phenol resin, a bisphenol A-novolak resin, and a multifunctional phenol resin such as tris(hydroxyphenyl) methane. However, the curing agent should not be restricted to these curing agents. The usage is not restricted to the use of a single curing agent, and two or more kinds can be used in combination.

In addition, in accordance with the present invention, it is possible to add, as required, such additives as accelerator (catalyst), inorganic filler, internal mold releasing agent, surface treating agent, pigment, flame retardant, and antioxidant.

An accelerator is not restricted insofar as it is an ordinary catalyst, and, as specific examples, it is possible to cite phosphoric compounds typified by phosphines such as triphenylphosphine, imidazoles such as 2-methyl-imidazole and 2-ethyl-4-methylimidazole, tertiary amines, 1,8-diazabicyclo(5,4,0)undecen-7, and organic salts thereof. They may be used singly or in combination. As for an amount to be added, 1% (weight %, abbreviated as % hereinafter) or less in the encapsulating resin composition is desirable. If the amount is 1% or more, gelation takes place too quickly, making it difficult to effect molding.

As for inorganic fillers, it is possible to cite natural silica, synthetic silica, pulverized quartz powders such as pulverized silica and globular silica in terms of the configuration, as well as talc, mica, silicon nitrides, and alumina. However, the inorganic fillers are not confined to the aforementioned ones. In addition, they may be used singly, or two or more kinds may be used in combination. An amount of inorganic filler to be added is preferably 250–1300 parts (parts by weight, abbreviated as parts herreinafter) with respect to 100 parts of an epoxy resin. If the amount is less than 250 parts, the strength is low, and trouble occurs in terms of heat resistance and thermal shock resistance. If the amount is more than 1300 parts, fluidity is poor, making it difficult to effect molding.

In addition, it is possible to employ mold releasing agent such as a fatty acid and its metal salts, natural wax, synthetic wax, a surface treating agent, a pigment such as carbon black, a fire retardant such as antimony trioxide, and an antioxidant.

A modified silicone oil in accordance with the present invention is expressed by the general formula:

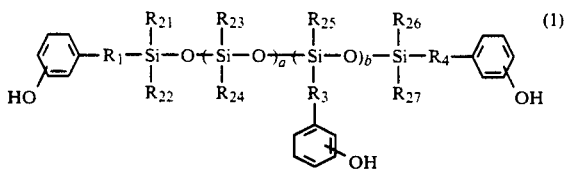

In Formula (1), $R_1$, $R_3$, and $R_4$ are divalent organic groups; $R_{21}$, $R_{22}$, $R_{24}$, $R_{25}$, $R_{26}$, and $R_{27}$ are respectively one kind selected from the group consisting of an alkyl group having from 1 to 5 carbon atoms, a hydroxyalkyl group having from 1 to 5 carbon atoms, an alkoxy group having from 1 to 5 carbon atoms, a phenyl group, and a fluorine-substituted alkyl group having from 1 to 5 carbon atoms; a is an integer from 10 to 300; b is an integer from 0 to 10, in which $0 \leq b/(a+b) \leq 0.32$.

$R_1$, $R_3$, and $R_4$ include, for instance, divalent saturated hydrocarbon groups such as methylene, ethylene, trimethylene, tetramethylene, and propylene, divalent groups including ether bonds from 0 to 10 carbon atoms, a phenylene group, divalent alicyclic hydrocarbon group, and a heterocyclic group. $R_1$, $R_3$, and $R_4$ may be identical or different. In addition, the number of siloxane units (a in Formula (1)) is an integer from 10 to 300, and if the value is smaller than 10, the amount of the reduction of the modulus of elasticity falls, while, if the value a is greater than 300, reactivity with an epoxy resin becomes extremely small, and the interfacial strength is weak, so that flaws can occur in properties such as crack resistance. For that reason, in the case of a silicone having a large value a, it is desirable to provide phenolic hydroxyl groups in the molecule in addition to both terminals. In that case, the value b is an integer from 0 to 10, and $0 \leq b/(a+b) \leq 0.32$. If the value $b/(a+b)$ becomes greater than 0.32, gelation occurs at the time of pre-reaction with the epoxy resin, and a stable flexibilizer cannot be obtained. In addition, the aforementioned silicone oils may be used singly, or two or more kinds may be used in combination.

In the pre-reaction for obtaining a flexibilizer by reacting the aforementioned modified silicone oil and the epoxy resin, the equivalent ratio of the phenolic hydroxyl groups in the phenol modified silicone oil to the epoxy groups of the epoxy resin (phenolic hydroxyl groups/epoxy groups) is preferably 0.4 or less. If the ratio is greater than 0.4, gelation occurs in pre-reaction with the epoxy resin, and a stable flexibilizer cannot be obtained. As the catalyst for pre-reaction, it is preferable to add 3 parts or less with respect to 100 parts of the silicone oil. A pre-reaction product thus synthesized is preferably one in which 70% or more of the phenolic hydroxyl groups in the silicone oil have reacted with the epoxy groups of the epoxy resin. In the case of a pre-reaction product in which less than 70% are reacted, drawbacks occur in that a decline in the strength as a semiconductor-encapsulating material becomes large, and that a reduction in weight becomes large in a case where the cured product is held for a long period of time at a high temperature.

As for the semiconductor-encapsulating epoxy resin composition in accordance with this embodiment, if it is assumed that the amount of the modified silicone oil added is [A], and organic components of the epoxy resin to be reacted with the modified silicone oil, other epoxy resins, a curing agent, etc. are [B], it is preferred that $[A]/\{[A]+[B]\}$ is from 3 to 20%, i.e., 0.03 to 0.2. If the ratio is below 3% (0.03), the effect of lowering the modulus of elasticity of the molded product is small, and an increase in the glass transition temperature is small. On the other hand, if the ratio exceeds 20% (0.2), a decline in the mechanical strength becomes appreciably large.

In the present invention, a copolymer obtained by pre-reaction of the silicone oil and the epoxy resin has a silicone polymer, which is a flexibilizing component, preliminarily bonded therein. This silicone polymer is obtained through arbitrary reaction of phenolic hydroxyl groups located at both terminals of the silicone polymer or at both terminals and inside the molecule on the one hand, and epoxy groups in the epoxy resin on the other. This silicone polymer is capable of toughening the interface between the silicone and the matrix.

Hereafter, a description will be given of an epoxy resin composition in accordance with a second embodiment of the present invention. As for an epoxy resin serving as a main agent and a curing agent which are employed in this epoxy resin composition, those described in the above-described first embodiment are used.

As for flexibilizers, the following two types of flexibilizer are used: a flexibilizer (hereafter referred to as the flexibilizer (A)) constituted by a pre-reaction product of a modified silicone oil (hereafter referred to as the modified silicone oil (a)) having hydroxyphenyl groups; and a flexibilizer (hereafter referred to as the flexibilizer (B)) constituted by a pre-reaction product of a modified silicone oil (hereafter referred to as the modified silicone oil (b)) having epoxy groups and a phenol resin.

The flexibilizer (A) is obtained by allowing reaction (pre-reaction) to take place in a nitrogen atmosphere by using the modified silicone oil (a), the epoxy resin, and catalysts including an amine compound, an imidazole compound, and a phosphoric compound.

The modified silicone oil (a) may have hydroxyphenyl groups at the terminals of the molecule and may contain them inside the molecular chain.

The hydroxyl group equivalent of the hydroxyphenyl groups of the modified silicone oil (a) is preferably from 500 to 30,000, more preferably from 1,000 to 10,000. In addition, the number of hydroxyphenyl groups per molecule is preferably from 1 to 15. In the case of the modified silicone oil (a) having hydroxyphenyl groups inside the molecular chain, from 1 to 10 hydroxyphenyl groups are preferably contained in the molecule. If the hydroxyl group equivalent of the hydroxyphenyl groups and the number of hydroxyphenyl groups per molecule exceed the aforementioned ranges, if the number of hydroxyphenyl groups is small, there is a tendency that reaction fails to proceed sufficiently at the time of reaction with the novolak-type epoxy resin, whereas, if the number of hydroxyphenyl groups is large, gelation is prone to occur during reaction.

In addition, the modified silicone oil (a) is one which is constituted by a siloxane skeleton and, as groups bonded to silicon atom, has one or more kinds selected from an alkyl group having from 1 to 5 carbon atoms, an alkoxy group having from 1 to 5 carbon atoms, a phenyl group, and a fluorine-substituted alkyl group having from 1 to 5 carbon atoms.

As specific examples of an epoxy resin to be reacted with the modified silicone oil (a), it is possible to cite the same epoxy resins used as the above-described main agent. In addition, the epoxy resin to be reacted with the modified silicone oil (a) and the epoxy resin used as a main agent may be of the same kind or different kinds.

The mixing ratio between the modified silicone oil (a) and the epoxy resin in the above-described reaction (pre-reaction) is preferably such that the equivalent ratio of the hydroxyl groups of the modified silicone oil (a) to the epoxy groups of the epoxy resin (phenolic hydroxyl groups/epoxy groups) is from 0.001 to 0.4. In particular, in a case where the modified silicone oil (a) having hydroxyphenyl groups at both terminals of the molecule is used, a ratio of from 0.01 to 0.3 is preferable.

If the equivalent ratio of the hydroxyl groups of the modified silicone oil (a) to the epoxy groups of the epoxy resin is smaller than 0.001, the proportion of the modified silicone oil component in the flexibilizer (A) becomes small, so that the flexibilizing effect tends not to be exhibited sufficiently. On the other hand, if the ratio is made greater than 0.4, gelation is prone to occur during pre-reaction, and there is a tendency that a stable flexibilizer (A) is difficult to obtain.

As specific examples of amine compounds used as catalysts, it is possible to cite, for example, N-methyl piperazine and hydroxymethylpiperazine. As specific examples of imidazole compounds, it is possible to cite such as 2-ethyl-4-methylimidazole, and 2-methylimidazole, benzimidazole. As for specific examples of phosphoric compounds, it is possible to cite such as trialkylphosphine, triphenylphosphine, alkyldiphenylphosphine, and dialkylphenylphosphine.

The flexibilizer (A) thus prepared is one in which 70% or more, preferably 90% or more, of the hydroxyl groups of the modified silicone oil (a) are reacted with the epoxy groups of the epoxy resin in pre-reaction so as to provide excellent heat resistance and high moisture resistance.

The flexibilizer (B) is obtained by allowing reaction (pre-reaction) to take place in a nitrogen atmosphere by using the modified silicone oil (b), the phenol resin, and catalysts including an amine compound, an imidazole compound, a phosphoric compound, and the like.

The modified silicone oil (b) may have epoxy groups at the terminals of the molecule or inside the molecular chain.

The epoxy equivalent of the modified silicone oil (b) is preferably from 500 to 40,000, more preferably from 500 to 20,000. The number of epoxy groups per molecule is preferably from 1 to 20, and in the case of the modified silicone oil (b) having epoxy groups inside the molecular chain, from 1 to 8 epoxy groups may be contained in the molecule. If the epoxy equivalent and the number of epoxy groups per molecule deviates from the aforementioned ranges, if the number of epoxy groups is small, there is a tendency that reaction fails to proceed sufficiently at the time of reaction with the novolak-type epoxy resin, whereas, if the number of epoxy groups is large, gelation is prone to occur during reaction.

In addition, the modified silicone oil (b) is one which is constituted by a siloxane skeleton and, as groups bonded to silicon atom, has one or more kinds selected from an alkyl group having from 1 to 5 carbon atoms, an alkoxy group having from 1 to 5 carbon atoms, a phenyl group, and a fluorine-substituted alkyl group having from 1 to 5 carbon atoms.

As specific examples of phenol resin to be reacted with the modified silicone oil (b), it is possible to cite the same phenol resins used as the above-described main curing agent. In addition, the phenol resin to be reacted with the modified silicone oil (b) and the phenol resin used as the curing agent may be of the same kind or different kinds.

The compounding ratio between the modified silicone oil (b) and the phenol resin in the above-described reaction (pre-reaction) is preferably such that the equivalent ratio of the epoxy groups of the modified silicone oil (b) to the hydroxyl groups of the phenol resin (epoxy groups/phenolic hydroxyl groups) is from 0.001 to 0.3. Particularly in the case where the modified silicone oil (b) having epoxy groups at both terminals of the molecule is used, a ratio from 0.01 to 0.3 is preferable.

If the equivalent ratio of the epoxy groups of the modified silicone oil (b) to the hydroxyl groups of the phenol resin is smaller than 0.001, the proportion of the modified silicone oil component in the flexibilizer (B) becomes small, so that the flexibilizing effect tends not to be exhibited sufficiently. On the other hand, if the ratio is made greater than 0.3, gelation is prone to occur during pre-reaction, and there is a tendency that a stable flexibilizer (B) is difficult to obtain.

As specific examples of amine compounds, imidazole compounds, and phosphoric compounds that are used as catalysts, it is possible to cite ones similar to those used in the preparation of the flexibilizer (A).

In the light of heat resistance and moisture resistance, it is preferred that the flexibilizer (B) thus prepared is one in which 70% or more, preferably 90% or more, of the epoxy groups of the modified silicone oil (b) are reacted with the hydroxyl groups of the phenol resin in pre-reaction.

The mixing ratio between the flexibilizer (A) and the flexibilizer (B) in the composition in accordance with this embodiment is such that if it is assumed that the total amount (weight) of the modified silicone oil (a) and the modified silicone oil (b) added is [C] and that the amount (weight) of organic components of the epoxy resin and the phenol resin for reaction with the modified silicone oil (a) and the modified silicone oil (b), the other epoxy resins, and the curing agent is [D], then [C]/{[C]+[D]} is from 0.03 to 0.3, preferably from 0.05 to 0.2. If this value is less than 0.03, the effect of reducing the modulus of elasticity of a molded product obtained and an increase in the glass transition temperature are small, and a decline in the expansion coefficient tends to be small. On the other hand, if the value exceeds 0.3, the mechanical strength disadvantageously declines.

In the composition according to this embodiment, it is preferable in the light of the object of the present invention that the ratio (epoxy groups/phenolic hydroxyl groups) between the total of the equivalent of the epoxy groups of the epoxy resin used as a main agent and the epoxy groups of the flexibilizer (A) on the one hand, and the total of the equivalent of the phenolic hydroxyl groups contained in the curing agent and the flexibilizer (B) is in the range of from 0.7 to 1.3.

The curing agents used in this embodiment are not particularly restricted insofar as they are catalysts that are generally used. As specific examples, it is possible to cite, for instance, phosphoric compounds typified by phosphines such as triphenylphosphine, imidazoles such as 2-mehtylimidazole and 2-ethyl-4-methylimidasole, tertiary amines, 1,8-diazabicyclo(5,4,0)undecen-7, and organic salts thereof. A single one of them may be used, or two or more of them may be used in combination. As for the amount of the accelerator added, from 0.03 to 1% in the composition in accordance with this embodiment is preferable, and from 0.05 to 0.7% is more preferable. If the amount of the accelerator added exceeds 1%, gelation is prone to take place too quickly, making it difficult to form a cured product. If said amount is less than 0.03%, curing tends to be carried out insufficiently.

The inorganic filler used in this embodiment is not particularly restricted, and, as specific examples, it is possible to cite pulverized quartz powders such as pulverized silica and globular silica obtained from natural silica or synthetic silica as well as talc, mica, silicon nitride, alumina, and the like. A single one of them may be used, or two or more kinds of them may be used in combination. The amount of the inorganic filler used is preferably from 250 to 1,300 parts, more preferably 400 to 1,100 parts with respect to a total of 100 parts of the epoxy resin used in the composition in accordance with this embodiment. If the amount used is less than 250 parts, the strength, heat resistance, and resistance to thermal shock of the cured object obtained decline, whereas, if the amount exceeds 1,300 parts, the fluidity of the composition declines, so that it tends to be difficult to effect molding.

A mold releasing agent (internal mold releasing agent) used in this embodiment is not particularly restricted, and as specific examples thereof, it is possible to cite a fatty acid and its metal salts, natural wax, and synthetic wax. The amount of the releasing agent used is preferably from 1 to 10 parts, more preferably from 3-7 parts, with respect to 100 parts of the epoxy resin.

A surface treating agent used in this embodiment is not particularly confined, and as specific examples thereof, it is possible to cite, for instance, vinyltrimethoxysilane, vinyltriethoxysilane, N(2-aminoethyl)3-aminopropylmethyldimethoxysilane, 3-aminopropylethoxysilane, 3-glycidoxypropyl trimethoxysilane, 3-glycidoxypropylmethyldimethoxysilane. The amount of the surface treating agent used is preferably from 1 to 20 parts, more preferably from 3 to 15 parts, with respect to 100 parts of epoxy resin.

Furthermore, a pigment such as carbon black, a flame retardant such as antimony trioxide, an antioxidant may be compounded in the composition of this embodiment, as required.

The composition of this embodiment can be prepared by mixing the aforementioned epoxy resin, curing agent, flexibilizer (A), flexibilizer (B), accelerator, filler, mold-releasing agent, surface-treating agent, and other required components in accordance with a conventional method (e.g. heat roll method).

The semiconductor-encapsulating epoxy resin composition in this embodiment is characterized by the combined use of the flexibilizer (A) and the flexibilizer (B), and since silicone oil serving as a flexibilizing component is introduced into both the epoxy resin, i.e., the chief material, and the phenol resin, i.e., the curing agent, the dispersibility of the silicone component in the matrix can be improved, and the heat resistance and moisture resistance can be improved.

A more detailed description will now be given of the epoxy resin composition in accordance with the first embodiment of the present invention on the basis of Examples 1 to 7 and Comparative Examples 1, 2.

EXAMPLE 1

50 parts of a modified silicone oil of the following general formula:

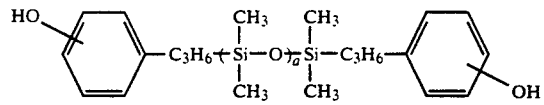

and has an average molecular weight of 1,200 and a phenolic hydroxyl group equivalent of 630 was reacted with 100 parts of a multifunctional epoxy resin (brandname: EPPN 502, made by Nippon Kayaku Co., Ltd.) having an epoxy equivalent (W. P. E.) of 170 and 1 part of triphenylphosphine in an nitrogen atmosphere at 140° C. to obtain a flexibilizer (1).

Then, 81 parts of the epoxy resin (EPPN-502) used in the flexibilizer (1), 10 parts of a phenol bromide novolak epoxy resin (brandname: BREN-S, made by Nippon Kayaku Co., Ltd.) having an epoxy equivalent (W. P. E.) of 280, 66 parts by weight of a phenol novolak resin (brandname: PSF-4261, made by Gunei Chemical Industry Co., Ltd.) which has a phenolic hydroxyl group equivalent of 105 and is added so that the total epoxy equivalent and the total phenolic hydroxyl group equivalent of the aforementioned epoxy resin become equal, 29 parts of the aforementioned flexibilizer (1), 1 part of triphenylphosphine (TPP), a silane coupling agent, an internal mold-releasing agent, molten silica powders used as an inorganic filler, antimony trioxide, and a coloring agent were mixed in loadings shown in Table 1, and were heated to facilitate mixing. A semiconductor-encapsulating epoxy resin composition in accordance with the first embodiment of the present invention was thereby obtained.

EXAMPLES 2, 3

A semiconductor-encapsulating epoxy resin composition was obtained in the same way as Example 1 except that the amounts of the flexibilizer (1) obtained in Example 1 and other components were varied, as shown in Table 1.

EXAMPLE 4

A flexibilizer (2) was obtained in the same way as Example 1 by using a modified silicone oil of the following formula:

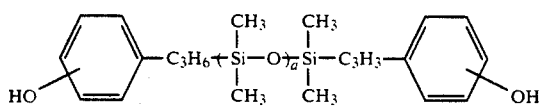

having an average molecular weight of 4,500 and a phenolic hydroxyl group equivalent of 2,200 instead of the modified silicone oil used in Example 1. Then, a semiconductor-encapsulating epoxy resin composition was obtained in the same way as Example 1 except that the amounts of the flexibilizer (2) and other components were varied, as shown in Table 1.

EXAMPLE 5

A flexibilizer (3) was obtained in the same way as Example 1 by using a modified silicone oil of the following formula:

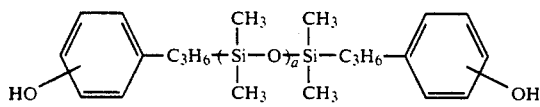

having an average molecular weight of 11,000 and a phenolic hydroxyl group equivalent of 5,600 instead of the modified silicone oil used in Example 1. Then, a semiconductor-encapsulating epoxy resin composition was obtained in the same way as Example 1 except that the amounts of the flexibilizer (3) and other components were varied, as shown in Table 1.

EXAMPLE 6

A flexibilizer (4) was obtained in the same way as Example 1 by using a modified silicone oil of the following formula:

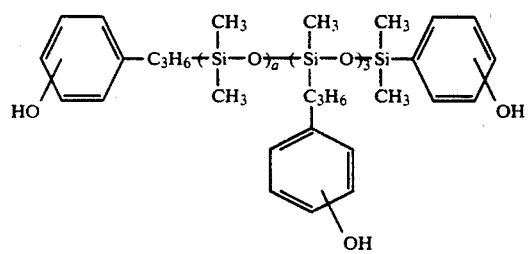

having an average molecular weight of 11,000 and a phenolic hydroxyl group equivalent of 2,100 instead of the modified silicone oil used in Example 1. Then, a semiconductor-encapsulating epoxy resin composition was obtained in the same way as Example 1 except that the amounts of the flexibilizer (4) and other components were varied, as shown in Table 1.

EXAMPLE 7

A semiconductor-encapsulating epoxy resin composition was obtained by setting the amount of the flexibilizer (4) synthesized in Example 6 and the amounts of other organic components in the same way as Example 6 except that 1,200 parts of an inorganic filler was mixed in.

COMPARATIVE EXAMPLE 1

An epoxy resin composition was obtained by using a silicone oil flexibilizer (5) having a phenolic hydroxyl group equivalent of 210 and mixing the components with the loadings shown in Table 1.

COMPARATIVE EXAMPLE 2

An epoxy resin composition was obtained without using any flexibilizer and by mixing the components with the loadings shown in Table 1.

TABLE 1

| | Epoxy Resin (parts) | | Phenol Curing Agent (Parts) | Catalyst (Parts) | Flexibilizer (Parts) | | | | | Inorganic filler (Parts) | Other Additive (Parts) | Results of Evaluation | | | |
|---|---|---|---|---|---|---|---|---|---|---|---|---|---|---|---|
| | EPPN 502 (W.P.E. 170) | BREN-S (W.P.E. 280) | (Hydroxyl Group Equivalent 105) | TPP | 1 | 2 | 3 | 4 | 5 | | | Modulus of Elasticity (kg/mm$^2$) | Glass Transition Temperature (°C.) | Coefficient of Thermal Expansion × 10$^6$ (°C.$^{-1}$) | Heat Cycle Failure Rate (%) |
| Examples | | | | | | | | | | | | | | | |
| 1 | 81 | 10 | 66 | 1 | 29 | — | — | — | — | 730 | 13 | 1700 | 206 | 16 | 20 |
| 2 | 60 | 10 | 66 | 1 | 61 | — | — | — | — | 770 | 13 | 1490 | 214 | 13 | 0 |
| 3 | 36 | 10 | 66 | 1 | 96 | — | — | — | — | 810 | 13 | 1310 | 220 | 12 | 0 |
| 4 | 60 | 10 | 66 | 1 | — | 61 | — | — | — | 770 | 13 | 1480 | 217 | 13 | 0 |
| 5 | 60 | 10 | 66 | 1 | — | — | 61 | — | — | 770 | 13 | 1450 | 215 | 13 | 0 |
| 6 | 60 | 10 | 66 | 1 | — | — | — | 61 | — | 770 | 13 | 1470 | 218 | 13 | 0 |
| 7 | 60 | 10 | 66 | 1 | — | — | — | 61 | — | 1200 | 13 | 1610 | 222 | 11 | 0 |
| Comparative Ex- | | | | | | | | | | | | | | | |

TABLE 1-continued

| | Epoxy Resin (parts) | | Phenol Curing Agent (Parts) (Hydroxyl Group Equivalent 105) | Catalyst (Parts) | Flexibilizer (Parts) | | | | | Inorganic filler (Parts) | Other Additive (Parts) | Results of Evaluation | | | |
|---|---|---|---|---|---|---|---|---|---|---|---|---|---|---|---|
| | EPPN 502 (W.P.E. 170) | BREN-S (W.P.E. 280) | | TPP | 1 | 2 | 3 | 4 | 5 | | | Modulus of Elasticity (kg/mm$^2$) | Glass Transition Temperature (°C) | Coefficient of Thermal Expansion × 10$^6$ (°C$^{-1}$) | Heat Cycle Failure Rate (%) |
| amples | | | | | | | | | | | | | | | |
| 1 | 60 | 10 | 66 | 1 | — | — | — | — | 61 | 770 | 13 | 1810 | 207 | 19 | 60 |
| 2 | 100 | 10 | 66 | 1 | — | — | — | — | — | 694 | 13 | 1950 | 204 | 17 | 100 |

Properties Test

Cured testpieces of epoxy resin compositions of the above-described Examples 1 to 6 and Comparative Examples 1, 2 were prepared, and the mechanical strength (JIS K 6911), the glass transition temperature, the coefficient of thermal expansion, and the package cracking properties after 100 heat cycles at −196° C.×30 sec to 260° C.×30 sec were measured for the respective testpieces. The results are shown in Table 1. As is apparent from Table 1, it can be appreciated that the cured products of the semiconductor-encapsulating epoxy resin compositions in accordance with the examples of the present invention exhibit high thermal resistances, low coefficients of thermal expansion, and low moduli of elasticity, attain glass transition temperatures equivalent to or higher than the conventional examples, possess moisture resistance by virtue of epoxy resin components, and thus can be used suitably for encapsulating semiconductor devices.

Next, a more specific description will be given of epoxy resin compositions in accordance with the second embodiment of the present invention on the basis of Examples 8 to 23 and Comparative Examples 3 to 5, but the present invention is not confined to these Examples.

EXAMPLE 8

50 parts of a modified silicone oil having a hydroxyl group equivalent of 1,100, hydroxyphenyl groups at both terminals of the molecular chain, and a polydimethylsiloxane skeleton, 100 parts of a novolak-type epoxy resin (EPPN 501 made by Nippon Kayaku Co., Ltd., epoxy equivalent (W. P. E.: 165), and 1 part of triphenylphosphine were reacted at 150° C. for about 20 hours while nitrogen was blowing into the mixture. Consequently, a pre-reaction product (plasticizer (A-1)) of the modified silicone oil having hydroxyphenyl groups at both terminals of the molecule and the epoxy resin. The reaction rate was 97%.

50 parts of a modified silicone oil having an epoxy equivalent of 1,300, epoxy groups at both terminals of the molecule, and a polydimethylsiloxane skeleton, 100 parts of a novolak-type phenol resin (PSF-4261 made by Gunei Chemical Industry Co., Ltd., hydroxyl group equivalent: 106) (equivalent ratio of epoxy groups to phenolic hydroxyl groups: 0.04), and 1 part of triphenylphosphine were reacted at 150° C. while nitrogen was being blown into the mixture. Consequently, a pre-reaction product (plasticizer (B-1)) of the modified silicone oil having epoxy groups at both terminals of the molecular chain and the phenol resin was obtained. The reaction rate was 95%.

The epoxy resin (EPPN-501), i.e., the chief material, the phenol bromide novolak-type epoxy resin (BREN-S made by Nippon Kayaku Co., Ltd.), the curing agent phenol novolak resin (PSF-4261), the accelerator (triphenylphosphine), the plasticizer (A-1), the flexibilizer (B-1), molten silica (RD-8 made by Tatsumori Co., Ltd.), antimony trioxide, and other materials (silane coupling agent, internal mold-releasing agent, and coloring agent) were mixed with the ratio shown in Table 2, were then kneaded by a heat roll, thereby obtaining a semiconductor-encapsulating epoxy resin composition.

The resultant composition was subjected to transfer molding at 175° C. for two minutes, and cured testpieces were prepared.

Using the cured testpieces thus obtained, measurement was made of the mechanical properties (JIS K 6911), the glass transition temperature, the coefficient of thermal expansion, and the package cracking property after 100 heat cycles at −196° C.×30 sec to 260° C.×30 sec. The results are shown in Table 2.

EXAMPLES 9-11

70 parts of a modified silicone oil having an epoxy equivalent of 2,300, epoxy groups at both terminals of the molecular chain, and a polydimethylsiloxane skeleton, 100 parts of the phenol novolak resin (PSF-4261) (equivalent ratio of epoxy groups to phenolic hydroxyl groups: 0.03), and 1 part of triphenylphosphine were reacted in the same way as Example 8, thereby obtaining a flexibilizer (B-2). The reaction rate was 95%.

100 parts of a modified silicone oil having an epoxy equivalent of 6,200, epoxy groups at both terminals of the molecular chain, and a polydimethylsiloxane skeleton, 100 parts of the phenol novolak resin (PSF-4261) (equivalent ratio of epoxy groups to phenolic hydroxyl groups: 0.02), and 1.2 parts of triphenylphosphine were reacted in the same way as Example 8, thereby obtaining a flexibilizer (B-3). The reaction rate was 94%.

90 parts of a modified silicone oil having an epoxy equivalent of 3,500, epoxy groups (about 4 per molecule) at both terminals and the inside of the molecular chain, and a polydimethylsiloxane skeleton, 100 parts of the phenol novolak resin (PSF-4261) (equivalent ratio of epoxy groups to phenolic hydroxyl groups: 0.03), and 1 part of triphenylphosphine were reacted in the same way as Example 8, thereby obtaining a flexibilizer (B-4). The reaction rate was 85%.

The flexibilizer (A-1) obtained in Example 8, the flexibilizer (B-2), the flexibilizer (B-3), and the flexibilizer (B-4) were used in combination, a semiconductor-encapsulating epoxy resin composition was obtained in the same way as Example 8 except that the other components were used at the proportions shown in Table 2.

Then, in the same way as Example 8, cured testpieces were prepared and their properties were measured. The results are shown in Table 2.

EXAMPLES 12 TO 23

Reaction was allowed to take place in the same way as Example 8 except that 80 parts of a modified silicone oil having a hydroxyl group equivalent of 2,700, hydroxyphenyl groups at both terminals of the molecular chain, and a polydimethylsiloxane skeleton, 100 parts of the epoxy resin (EPPN-501) (equivalent ratio of phenolic hydroxyl groups to epoxy groups: 0.05), and 1 part of triphenylphosphine were used, and a flexibilizer (A-2) was thereby obtained. The reaction rate was 96%.

110 parts of a modified silicone oil having a hydroxyl group equivalent of 5,800, hydroxyphenyl groups at both terminals of the molecular chain, and a polydimethylsiloxane skeleton, 100 parts of the epoxy resin (EPPN-501) (equivalent ratio of phenolic hydroxyl groups to epoxy groups: 0.03), and 1.2 parts of triphenylphosphine were used, and reaction was allowed to take place in the same way as Example 8, thereby obtaining a flexibilizer (A-3). The reaction rate was 93%.

70 parts of a modified silicone oil having a hydroxyl group equivalent of 3,800, hydroxyphenyl groups (about 4 per molecule) at both terminals and the inside of the molecular chain, and a polydimethylsiloxane skeleton, 100 parts of the epoxy resin (EPPN-501) (equivalent ratio of phenolic hydroxyl groups to epoxy groups: 0.03), and 1 part of triphenylphosphine were used, and reaction was allowed to take place in the same way as Example 8, thereby obtaining a flexibilizer (A-4) was thereby obtained. The reaction rate was 92%.

The flexibilizer (B-1), the flexibilizer (B-2), the flexibilizer (B-3), and the flexibilizer (B-4), which were respectively obtained in Examples 8-11, as well as the flexibilizer (A-2), the flexibilizer (A-3), and the flexibilizer (A-4) were used in combination, and a semiconductor-encapsulating epoxy resin composition was obtained in the same way as Example 8 except that the other components were used in the proportions shown in Table 2.

Subsequently, cured testpieces were prepared in the same way as Example 8, and their properties were measured. The results are shown in Table 2.

COMPARATIVE EXAMPLES 3-4

An epoxy resin composition with loadings shown in Table 2 was obtained in the same way as Example 8, using as a flexibilizer Araldite GY 298 (Comparative Example 3) made by Ciba-Geigy (Japan) Ltd. or DER 736 (Comparative Example made by Dow Chemical Japan Ltd.

Subsequently, testpieces were prepared in the same way as Example 8, and their properties were measured. The results are shown in Table 2.

COMPARATIVE EXAMPLE 5

An epoxy resin composition with loadings shown in Table 2 was obtained in the same way as Example 8 except that no flexibilizer was used.

Subsequently, testpieces were prepared in the same way as Example 8, and their properties were measured. The results are shown in Table 2.

TABLE 2

| | Epoxy Resin (Parts) | | Phenol Curing Agent (Parts) PSF4261 | | Flexibilizer (Parts) | | | | | | | | | |
|---|---|---|---|---|---|---|---|---|---|---|---|---|---|---|
| | EPPN 501 (W.P.E. 164) | BREN-S (W.P.E. 280) | (Hydroxyl Group Equivalent 106) | Accelerator (Parts) | A | | | | B | | | | GY 298 | PER 736 |
| | | | | | A-1 | A-2 | A-3 | A-4 | B-1 | B-2 | B-3 | B-4 | | |
| Examples | | | | | | | | | | | | | | |
| 8 | 79 | 10 | 47.5 | 1 | 31.4 | — | — | — | 31.4 | — | — | — | — | — |
| 9 | 79 | 10 | 53.5 | 1 | 31.4 | — | — | — | — | 25.4 | — | — | — | — |
| 10 | 79 | 10 | 57.9 | 1 | 31.4 | — | — | — | — | — | 20.9 | — | — | — |
| 11 | 79 | 10 | 56.8 | 1 | 31.4 | — | — | — | — | — | — | 22.1 | — | — |
| 12 | 87 | 10 | 47.5 | 1 | — | 23.6 | — | — | 31.4 | — | — | — | — | — |
| 13 | 87 | 10 | 53.5 | 1 | — | 23.6 | — | — | — | 25.4 | — | — | — | — |
| 14 | 87 | 10 | 57.9 | 1 | — | 23.6 | — | — | — | — | 20.9 | — | — | — |
| 15 | 87 | 10 | 56.8 | 1 | — | 23.6 | — | — | — | — | — | 22.1 | — | — |
| 16 | 90.5 | 10 | 47.5 | 1 | — | — | 20 | — | 31.4 | — | — | — | — | — |
| 17 | 90.5 | 10 | 53.5 | 1 | — | — | 20 | — | — | 25.4 | — | — | — | — |
| 18 | 90.5 | 10 | 57.9 | 1 | — | — | 20 | — | — | — | 20.9 | — | — | — |
| 19 | 90.5 | 10 | 56.8 | 1 | — | — | 20 | — | — | — | — | 22.1 | — | — |
| 20 | 85 | 10 | 47.5 | 1 | — | — | — | 25.4 | 31.4 | — | — | — | — | — |
| 21 | 85 | 10 | 53.5 | 1 | — | — | — | 25.4 | — | 25.4 | — | — | — | — |
| 22 | 85 | 10 | 57.9 | 1 | — | — | — | 25.4 | — | — | 20.9 | — | — | — |
| 23 | 85 | 10 | 56.8 | 1 | — | — | — | 25.4 | — | — | — | 22.1 | — | — |
| Comparative Examples | | | | | | | | | | | | | | |
| 3 | 100 | 10 | 68.4 | 1 | — | — | — | — | — | — | — | — | 21 | — |
| 4 | 100 | 10 | 68.4 | 1 | — | — | — | — | — | — | — | — | — | 21 |
| 5 | 100 | 10 | 68.4 | 1 | — | — | — | — | — | — | — | — | — | — |

| | | | Results of Evaluation | | | |
|---|---|---|---|---|---|---|
| | Inorganic filler (Parts) | *Other Additive (Parts) | Modulus of Elasticity (kg/mm$^2$) | Glass Transition Temperature (°C.) | Coefficient of Thermal Expansion × 10$^6$ (°C.$^{-1}$) | Heat Cycle Failure Rate (%) |
| Examples | | | | | | |
| 8 | 640 | 13 | 1410 | 193 | 17 | 20 |
| 9 | 640 | 13 | 1300 | 191 | 17 | 10 |
| 10 | 640 | 13 | 1290 | 193 | 15 | 0 |
| 11 | 640 | 13 | 1420 | 193 | 15 | 5 |
| 12 | 640 | 13 | 1310 | 195 | 15 | 0 |
| 13 | 640 | 13 | 1290 | 192 | 16 | 0 |

TABLE 2-continued

| | | | | | | |
|---|---|---|---|---|---|---|
| 14 | 640 | 13 | 1260 | 193 | 15 | 0 |
| 15 | 640 | 13 | 1350 | 195 | 15 | 0 |
| 16 | 640 | 13 | 1310 | 192 | 16 | 0 |
| 17 | 640 | 13 | 1270 | 194 | 15 | 0 |
| 18 | 640 | 13 | 1250 | 193 | 15 | 0 |
| 19 | 640 | 13 | 1320 | 195 | 16 | 0 |
| 20 | 640 | 13 | 1380 | 195 | 16 | 5 |
| 21 | 640 | 13 | 1300 | 195 | 16 | 0 |
| 22 | 640 | 13 | 1270 | 196 | 16 | 0 |
| 23 | 640 | 13 | 1390 | 193 | 16 | 5 |
| Comparative Examples | | | | | | |
| 3 | 640 | 13 | 1440 | 165 | 19 | 50 |
| 4 | 640 | 13 | 1450 | 174 | 20 | 55 |
| 5 | 577 | 13 | 1820 | 190 | 18 | 100 |

*7 parts of silane coupling agent (KBM403 made by Shinetcu Chemical Industry Co., Ltd.), 3 parts of internal mold-releasing agent (carnauba wax), and 3 parts of coloring agent (carbon black)

As is apparent from Table 2, it can be appreciated that cured products obtained from the semiconductor-encapsulating epoxy resin composition have high heat resistance, low coefficients of thermal expansion, and low moduli of elasticity, and high glass transition temperatures equivalent to or higher than those of conventional ones, and can be used suitably for encapsulating semiconductor devices.

What is claimed is:

1. An epoxy resin composition for encapsulating a semiconductor device comprising:
    a flexibilizer obtained by pre-reaction of an epoxy resin and at least one modified silicone oil having the formula:

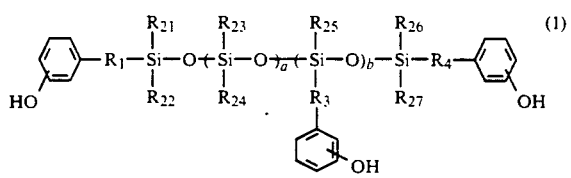

where $R_1$, $R_3$, and $R_4$ are divalent organic groups; $R_{21}$, $R_{22}$, $R_{23}$, $R_{24}$, $R_{25}$, $R_{26}$, and $R_{27}$ are respectively selected from the group consisting of an alkyl group having from 1 to 5 carbon atoms, a hydroxyalkyl group having from to 5 carbon atoms, an alkoxy group having from 1 to 5 carbon atoms, a phenyl group, and a fluorine-substituted alkyl group having from 1 to 5 carbon atoms; a is an integer from 10 to 300; b is an integer from 2 to 10, in which $0 \leq b/(a+b) \leq 0.32$ wherein the equivalent ratio of phenolic hydroxyl groups in said modified silicone oil to epoxy groups of the epoxy resin of the flexibilizer is from 0.001 to 0.4:1;
    an epoxy resin other than the flexibilizer; and
    a curing agent.

2. The composition according to claim 1 wherein 70% or more of phenolic hydroxyl groups in said modified silicone oil are reacted with the epoxy groups of said epoxy resin.

3. The composition according to claim 1 wherein the amount of said modified silicone oil added is [A], and the epoxy resin pre-reacted with said modified silicone oil, other epoxy resin, and curing agent are [B], and [A]/{[A]+[B]}is, from 0.03 to 0.2.

4. The composition according to claim 1 wherein said epoxy resin is at least one selected from the group consisting of a cresol-novolack epoxy resin, a phenol-novolak epoxy resin, an alkyl benzene-modified phenol-novolak epoxy resin, a halogenated phenol-novolak-type epoxy resin, a bisphenol A-novolak epoxy resin, and tris(glycidoxyphenyl) methane.

5. The composition according to claim 1 wherein said curing agent comprises at least one of a phenol-novolak resin, a cresol-novolak resin, an alkyl-modified phenol resin, a bisphenol A-novolak resin or tris(glycidoxyphenyl) methane.

6. The composition according to claim 1 wherein said curing agent comprises at least one phenol novolak.

7. The composition according to claim 1 further comprising an accelerator.

8. The composition according to claim 7 wherein said accelerator is at least one selected from the group consisting of phosphines, imidazoles, tertiary amines, and organic salts thereof.

9. The composition according to claim 7 wherein said accelerator comprises at least one of triphenylphosphine, 2-methylimidazole, 2-ethyl-4-methylimidazole, 1,8-diazabicyclo(5,4,0)undecen-7, and organic salts thereof.

10. The composition according to claim 7 wherein the amount of said accelerator added is 1 weight % or less with respect to said resin composition.

11. The composition according to claim 1 further comprising an inorganic filler.

12. The composition according to claim 11 wherein said inorganic filler is at least one selected from the group consisting of natural silica, synthesized silica, talc, mica, silicon nitride, and alumina.

13. The composition according to claim 11 wherein the amount of said inorganic filler added is from 250 to 1,300 parts by weight with respect to 100 parts by weight of said epoxy resin.

14. The composition according to claim 1 further comprising a mold-releasing agent.

15. The composition according to claim 14 wherein said mold-releasing agent is at least one selected from the group consisting of a fatty acid and metal salts thereof, natural wax, and synthetic wax.

16. The composition according to claim 1 further comprising a-surface-treating agent.

17. The composition according to claim 1 further comprising a flame retardant.

18. The composition according to claim 1 further comprising a pigment.

19. The composition according to claim 1 further comprising an antioxidant.

* * * * *

UNITED STATES PATENT AND TRADEMARK OFFICE
CERTIFICATE OF CORRECTION

PATENT NO. : 5,157,061
DATED : October 20, 1992
INVENTOR(S) : Ito et al.

It is certified that error appears in the above-identified patent and that said Letters Patent is hereby corrected as shown below:

Claim 1, column 15, line 45, after "from" insert --1--.

Claim 16, column 16, line 60, change "a-surface-treating" to --a surface-treating--.

Claim 4, column 16, line 20, delete "type".

Signed and Sealed this

Second Day of November, 1993

Attest:

BRUCE LEHMAN

*Attesting Officer*  *Commissioner of Patents and Trademarks*